(12) United States Patent
 Kim et al.

(10) Patent No.: US 12,631,184 B2
(45) Date of Patent: May 19, 2026

(54) ELECTRIC COMPRESSOR HAVING AN INTERNAL FLOW PATH ARRANGED ON AN OPPOSITE SIDE OF A SUCTION PORT RELATIVE TO A FIRST PLANE

(71) Applicant: Hanon Systems, Daejeon (KR)

(72) Inventors: Hong Min Kim, Daejeon (KR); Sang Ho Kim, Daejeon (KR); Gu Hyun Ryu, Daejeon (KR); Chi Myeong Moon, Daejeon (KR); In Cheol Shin, Daejeon (KR); Jun Ha Yoo, Daejeon (KR)

(73) Assignee: HANON SYSTEMS (KR)

( * ) Notice: Subject to any disclaimer, the term of this patent is extended or adjusted under 35 U.S.C. 154(b) by 0 days.

(21) Appl. No.: 18/845,627

(22) PCT Filed: Apr. 14, 2023

(86) PCT No.: PCT/KR2023/005058
§ 371 (c)(1),
(2) Date: Sep. 10, 2024

(87) PCT Pub. No.: WO2024/080466
PCT Pub. Date: Apr. 18, 2024

(65) Prior Publication Data
US 2025/0237217 A1     Jul. 24, 2025

(30) Foreign Application Priority Data
Oct. 14, 2022    (KR) ........................ 10-2022-0132352

(51) Int. Cl.
*F04C 29/04*        (2006.01)
*F04C 18/02*        (2006.01)
(Continued)

(52) U.S. Cl.
CPC ........ *F04C 29/045* (2013.01); *F04C 18/0215* (2013.01); *F04C 23/008* (2013.01);
(Continued)

(58) Field of Classification Search
CPC ... F04C 29/045; F04C 29/047; F04C 2240/30
See application file for complete search history.

(56) References Cited

U.S. PATENT DOCUMENTS

| | | | | |
|---|---|---|---|---|
| 2002/0039532 A1* | 4/2002 | Saito | ..................... | F04C 29/045 417/410.5 |
| 2009/0151389 A1* | 6/2009 | Iguchi | ................... | F04C 29/047 62/505 |
| 2013/0248022 A1* | 9/2013 | Roof | ..................... | F04C 23/008 137/544 |

FOREIGN PATENT DOCUMENTS

| | | | | | |
|---|---|---|---|---|---|
| EP | 2873858 A1 * | 5/2015 | .............. | F04B 35/04 |
| JP | 2005201108 A * | 7/2005 | | |

(Continued)

*Primary Examiner* — Laert Dounis

(74) *Attorney, Agent, or Firm* — Shumaker, Loop & Kendrick, LLP; James D. Miller

(57) ABSTRACT

An electric compressor including: a compression mechanism that receives power from a motor and compresses refrigerant; and an inverter that controls the motor. The housing receiving the motor and the inverter includes a partition wall that divides a motor receiving space and an inverter receiving space, and a suction port that introduces refrigerant from the outside to the motor receiving space. At least one internal flow path is formed between an inner circumferential surface of the housing and an outer circumferential surface of the motor. The internal flow path and the suction port are formed on opposite sides of each other with respect to a first plane, that is, an imaginary plane which includes a central axis of the housing and is perpendicular to the ground.

14 Claims, 12 Drawing Sheets

(51) Int. Cl.

| | | |
|---|---|---|
| *F04C 23/00* | (2006.01) | |
| *F04C 23/02* | (2006.01) | |
| *F04C 29/00* | (2006.01) | |
| *F25B 31/02* | (2006.01) | |
| *H02K 5/20* | (2006.01) | |
| *H02M 7/00* | (2006.01) | |
| *H05K 7/20* | (2006.01) | |

(52) U.S. Cl.

CPC .............. *F04C 23/02* (2013.01); *F04C 29/00* (2013.01); *F04C 29/04* (2013.01); *F04C 29/047* (2013.01); *F25B 31/02* (2013.01); *H02K 5/20* (2013.01); *H02M 7/003* (2013.01); *H05K 7/2089* (2013.01); *F04C 2240/30* (2013.01); *F04C 2240/403* (2013.01); *F04C 2240/808* (2013.01)

(56) References Cited

FOREIGN PATENT DOCUMENTS

| | | | | | |
|---|---|---|---|---|---|
| JP | 2008-190452 | A | | 8/2008 | |
| JP | 6178309 | B2 | | 8/2017 | |
| KR | 10-2011-0072323 | A | | 6/2011 | |
| KR | 20110072323 | A | * | 6/2011 | .............. F01C 21/10 |
| KR | 10-2012-0090305 | A | | 8/2012 | |
| KR | 20130011634 | A | * | 1/2013 | .......... F04C 29/0021 |
| KR | 20150033072 | A | * | 4/2015 | ........... F04C 23/008 |
| WO | WO-2020153682 | A1 | * | 7/2020 | ............. H02K 5/203 |

* cited by examiner

ELECTRIC COMPRESSOR HAVING AN INTERNAL FLOW PATH ARRANGED ON AN OPPOSITE SIDE OF A SUCTION PORT RELATIVE TO A FIRST PLANE

CROSS REFERENCE TO RELATED PATENT APPLICATIONS

This is a U.S. national phase patent application of PCT/KR2023/005058 filed Apr. 14, 2023 which claims the benefit of and priority to Korean Patent Application No. KR 10-2022-0132352 filed on Oct. 14, 2022, the entire contents of each of which are incorporated herein by reference for all purposes.

TECHNICAL FIELD

The present disclosure relates to an electric compressor and more particularly to an electric compressor capable of compressing a refrigerant by a driving force of a motor controlled by an inverter.

BACKGROUND ART

In general, a compressor is a device for compressing a fluid such as a refrigerant gas, etc., and is applied to an air-conditioning system of a building, an air-conditioning system for a vehicle, etc.

The compressor may be divided, according to a compression type, into a reciprocating type compressor that compresses the refrigerant through a reciprocating motion of a piston and a rotary type compressor that compresses the refrigerant while rotating. The reciprocating type compressor may be divided into a crank type compressor that transmits power to a plurality of pistons by using a crank according to a power transmission method, a swash plate type compressor that transmits power to a rotating shaft on which the swash plate is installed, etc. The rotary type compressor may be divided into a vane rotary type compressor using a rotating shaft and a vane and a scroll type compressor using an orbiting scroll and a fixed scroll.

Also, the compressor may be divided according to a driving method into a mechanical compressor that uses an engine and an electric compressor that uses a motor.

Here, an inverter for controlling a motor is applied to the electric compressor in order to adjust the compression capacity, and a structure for cooling a heat-generating device of the inverter is applied.

FIG. 1 is a cross-sectional view showing a conventional electric compressor. FIG. 2 is a perspective view showing the electric compressor of FIG. 1 of which a front housing is partially cut away. FIG. 3 is a front view showing that some parts of a motor are received in the front housing of FIG. 2. FIG. 4 is a front view showing a communication hole that guides refrigerant within a motor receiving space of FIG. 3 to a compression mechanism. FIG. 5 is a temperature distribution diagram showing a temperature distribution of an inverter device in the electric compressor of FIG. 1. For reference, in FIG. 5, the higher the temperature, the darker the shading.

Referring to the attached FIGS. 1 to 5, the conventional electric compressor includes a motor 6 that generates power, a compression mechanism 4 that receives the power from the motor 6 and compresses the refrigerant, and an inverter 8 that controls the motor 6.

Here, a housing 2 that receives the motor 6 and the inverter 8 includes a partition wall 242 dividing a motor receiving space S1 where the motor 6 is received and an inverter receiving space S2 where the inverter 8 is received, an annular wall 244 extending from the outer circumferential portion of the partition wall 242 and supporting the outer circumferential surface of the motor 6, a suction port 2442 passing through the annular wall 244 to introduce the refrigerant into the motor receiving space S1, and a plurality of internal flow paths 2444' that is engraved on the inner circumferential surface of the annular wall 244, is spaced apart from the outer circumferential surface of the motor 6, and extends toward the compression mechanism 4. The plurality of flow paths 2444' are arranged apart from each other in the circumferential direction of the annular wall 244.

Also, the housing 2 further includes a main frame 222 and a plurality of communication holes 2224'. The main frame 222 divides a compression mechanism receiving space S3 that receives the compression mechanism 4 from the motor receiving space S1. The plurality of communication holes 2224' passes through the main frame 222 and communicates the motor receiving space S1 with the compression mechanism receiving space S3. The plurality of communication holes 2224' are arranged apart from each other in the circumferential direction of the main frame 222.

Also, the inverter 8 includes a plurality of devices 84, and at least a portion of the plurality of devices 84 contacts the partition wall 242 in the inverter receiving space S2.

In the conventional electric compressor based on such a configuration, when power is applied to the motor 6, the refrigerant is introduced into the motor receiving space S1 through the suction port 2442, and the refrigerant in the motor receiving space S1 is introduced into the compression mechanism 4 through the plurality of internal flow paths 2444' and the plurality of communication holes 2224' and is compressed. Then, the refrigerant is discharged to the outside of the housing 2.

Also, in this process, the motor 6 is controlled by the inverter 8, and thus, the cooling efficiency is variably controlled. The heat generated from the device 84 of the inverter 8 is radiated to the refrigerant in the motor receiving space S1 through the partition wall 242.

However, in such a conventional electric compressor, the plurality of devices 84 of the inverter 8 are not sufficiently cooled as a whole, and a temperature deviation occurs between the plurality of devices 84 as shown in FIG. 5, resulting in damage of the device 84 of the inverter 8 by fire, the operation stop of the electric compressor, and increase in maintenance cost accordingly.

SUMMARY

The purpose of the present disclosure is to provide an electric compressor capable of sufficiently cooling a plurality of elements of an inverter as a whole and of suppressing temperature deviation between the plurality of elements, thereby suppressing damage by fire, operation stop, and increase in maintenance cost.

One embodiment is an electric compressor including: a motor that generates power; a compression mechanism that receives the power from the motor and compresses refrigerant; and an inverter that controls the motor. A housing receiving the motor and the inverter includes a partition wall that divides a motor receiving space where the motor is received and an inverter receiving space where the inverter is received, and a suction port that introduces refrigerant from the outside to the motor receiving space. At least one internal flow path is formed between an inner circumferential surface of the housing and an outer circumferential surface of the motor. The internal flow path and the suction port are formed on opposite sides of each other with respect to a first plane, that is, an imaginary plane which includes a central axis of the housing and is perpendicular to the ground.

The housing may be divided into a housing first portion located on one side of the first plane and a housing second portion located on a side opposite to the housing first portion. An annular wall of the housing, which supports the outer circumferential surface of the motor, includes an annular wall first portion included in the housing first portion and an annular wall second portion included in the housing second portion, the suction port may be formed in the annular wall first portion, and the internal flow path may be formed in the annular wall second portion.

An inner circumferential surface of the annular wall first portion may be in contact with the outer circumferential surface of the motor as a whole.

The housing may further include a main frame which divides a compression mechanism receiving space that receives the compression mechanism from the motor receiving space, and a communication hole which passes through the main frame and communicates the motor receiving space with the compression mechanism receiving space. The main frame includes a main frame second portion included in the housing second portion, the communication hole may be formed in the main frame second portion.

An imaginary plane that includes the central axis of the housing and is perpendicular to the first plane is set to a second plane. The housing first portion may be divided into a housing first-first portion located on one side of the second plane and a housing first-second portion located on a side opposite to the housing first-first portion. The housing second portion may be divided into a housing second-first portion located on one side of the second plane and a housing second-second portion located on a side opposite to the housing second-first portion. With respect to the central axis of the housing, the housing first-first portion and the housing second-second portion may be located opposite to each other, and the housing first-second portion and the housing second-first portion may be located opposite to each other. The suction port may be formed in an annular wall first-first portion of the annular wall, which is included in the housing first-first portion. The internal flow path may include a first internal flow path formed in an annular wall second-first portion of the annular wall, which is included in the housing second-first portion. The communication hole may be formed in a main frame second-first portion of the main frame, which is included in the housing second-first portion.

The suction port may be formed to open towards an annular wall first-second portion of the annular wall, which is included in the housing first-second portion.

The internal flow path may further include a second internal flow path formed in an annular wall second-second portion of the annular wall, which is included in the housing second-second portion.

The communication hole may be formed to be in communication with a space between the first internal flow path and the second internal flow path in a circumferential direction.

The partition wall may include a rib which protrudes from a surface facing the motor receiving space.

The rib may include a first rib which extends in a circumferential direction of the motor receiving space.

The first rib may extend from a partition wall first portion of the partition wall, which is included in the housing first portion, to a partition wall second portion of the partition wall, which is included in the housing second portion.

The first rib may be formed in plural numbers, and the plurality of first ribs are formed apart from each other in a radial direction of the motor receiving space.

The farther at least one of the plurality of first ribs is from the suction port in the circumferential direction of the motor receiving space, the more a radius of curvature of the first rib may decrease.

A spaced distance between the plurality of first ribs at a position adjacent to the suction port in the circumferential direction of the motor receiving space may be formed to be greater than a spaced distance between the plurality of first ribs at a position remote from the suction port.

The rib may include a second rib which extends in a radial direction of the motor receiving space.

The inverter may include a switching element, and at least a portion of the switching element may be in contact with the partition wall in the inverter receiving space.

The electric compressor according to the embodiment of the present disclosure includes: a motor that generates power; a compression mechanism that receives the power from the motor; and an inverter that controls the motor. A housing receiving the motor and the inverter includes a partition wall that divides a motor receiving space where the motor is received and an inverter receiving space where the inverter is received, and a suction port that introduces refrigerant from the outside to the motor receiving space. At least one internal flow path is formed between an inner circumferential surface of the housing and an outer circumferential surface of the motor. The internal flow path and the suction port are formed on opposite sides of each other with respect to a first plane, that is, an imaginary plane which includes a central axis of the housing and is perpendicular to the ground. As a result, it is possible to sufficiently cool a plurality of elements of an inverter as a whole and suppress temperature deviation between the plurality of elements, thereby suppressing damage by fire, operation stop, and increase in maintenance cost.

DESCRIPTION OF AN EMBODIMENT

Hereinafter, an electric compressor according to an embodiment of the present disclosure will be described in detail with reference to the accompanying drawings.

Figure 5:
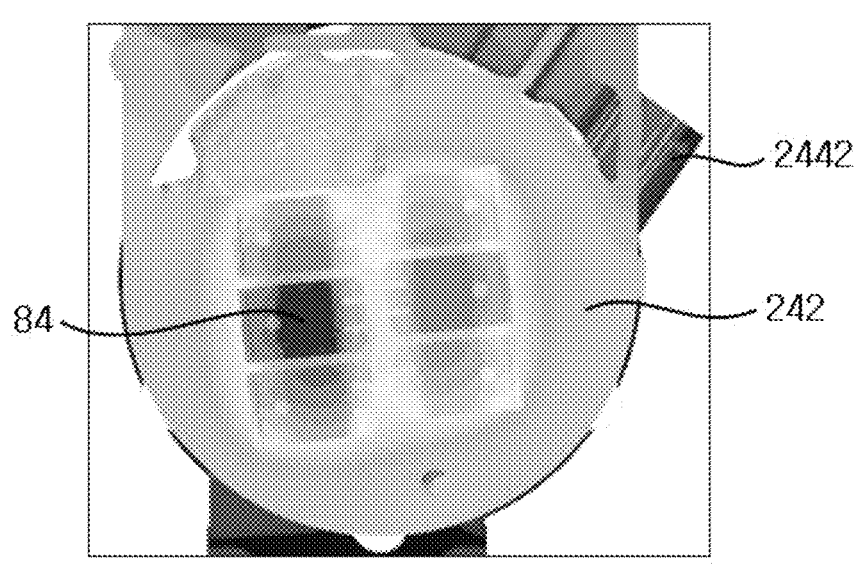
FIG. 5 is a temperature distribution diagram showing a temperature distribution of an inverter device in the electric compressor of FIG. 1.
Figure 6:
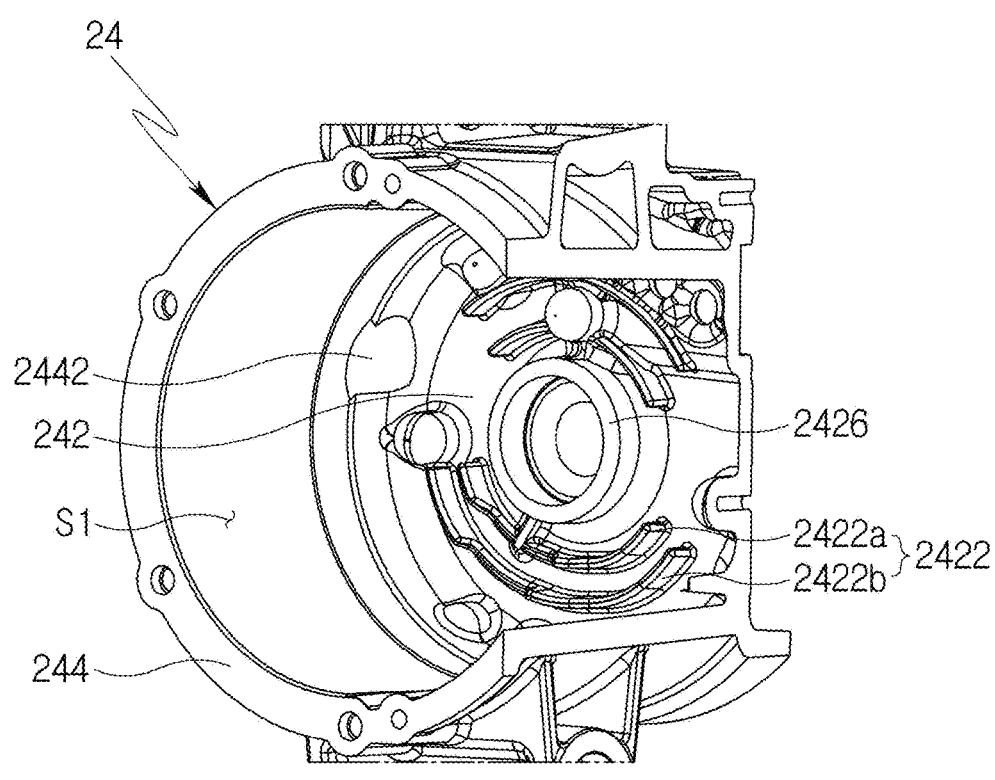
FIG. 6 is a perspective view showing an electric compressor according to an embodiment of the present disclosure of which a front housing is partially cut away.
Figure 7:
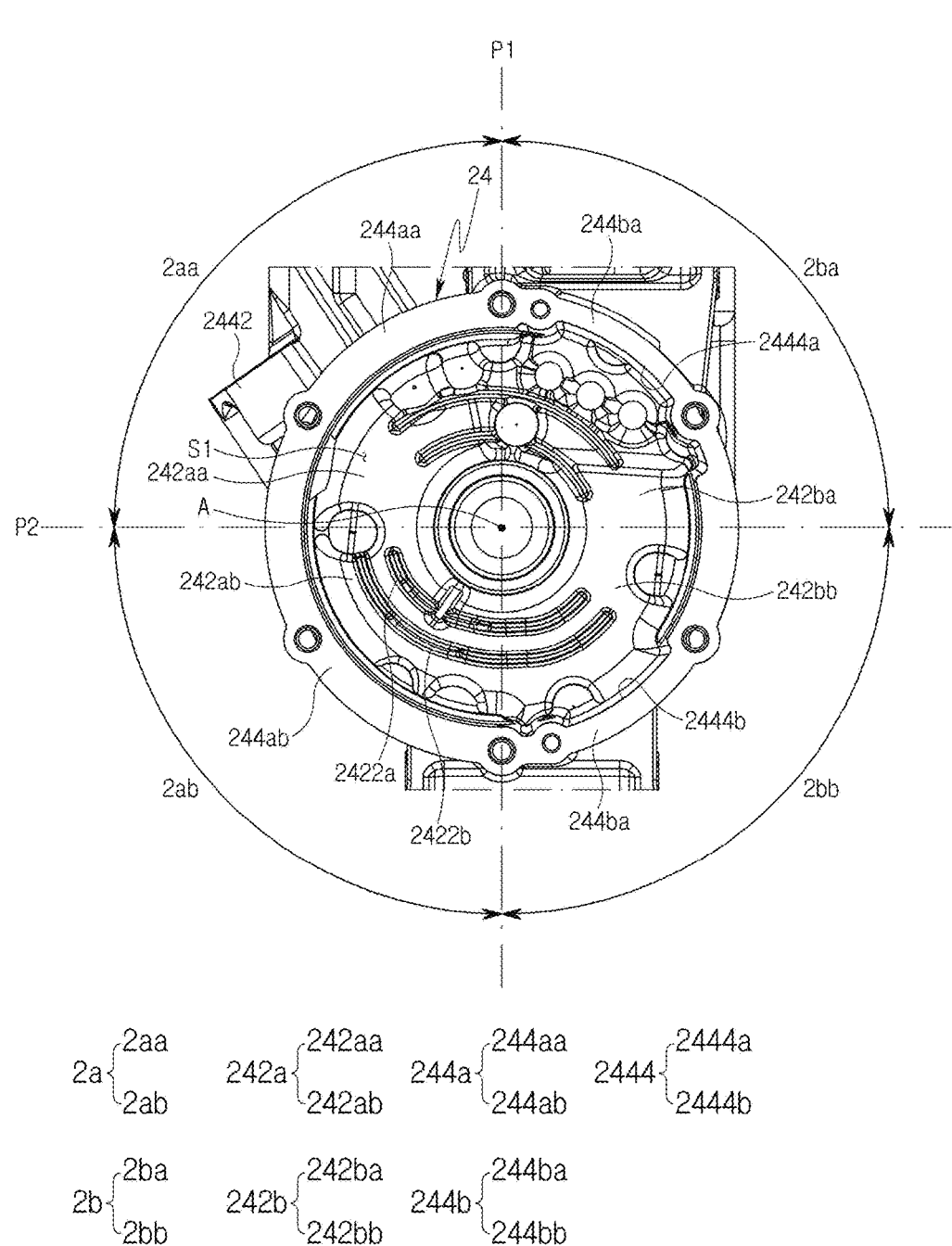
FIG. 7 is a front view of FIG. 6.
Figure 8:
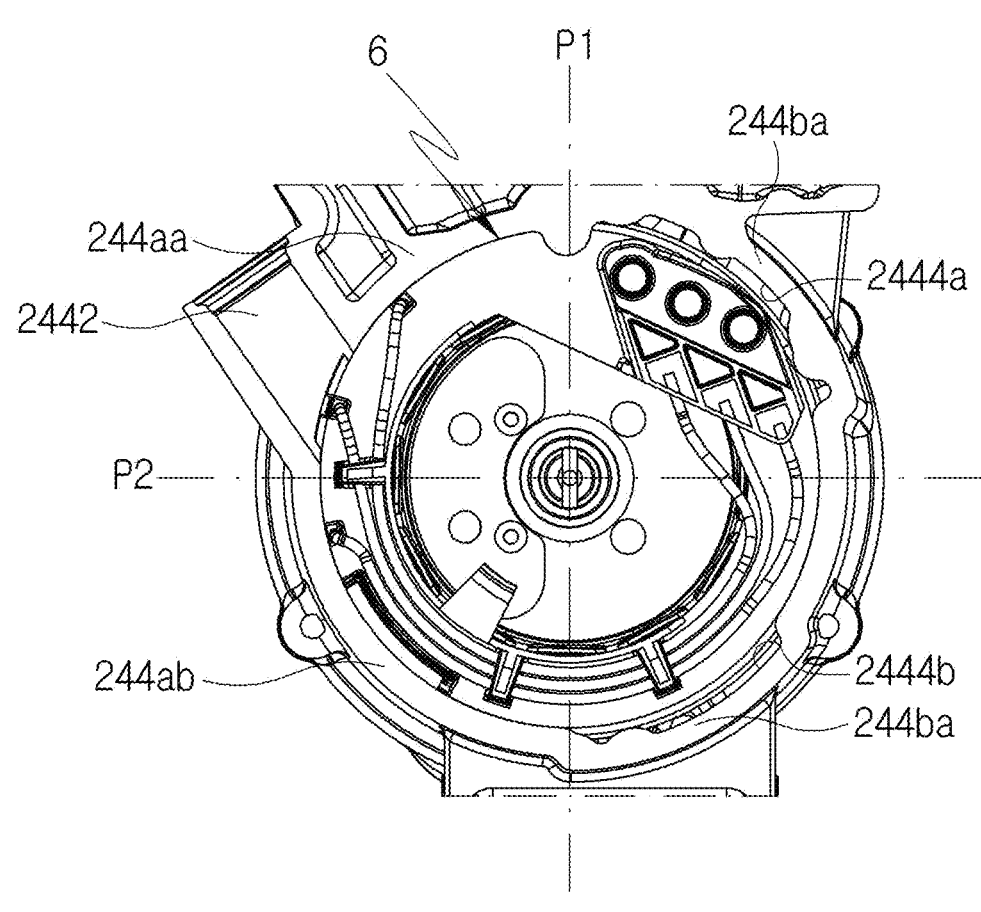
FIG. 8 is a front view showing that some parts of a motor are received in the front housing of FIG. 7.
Figure 9:
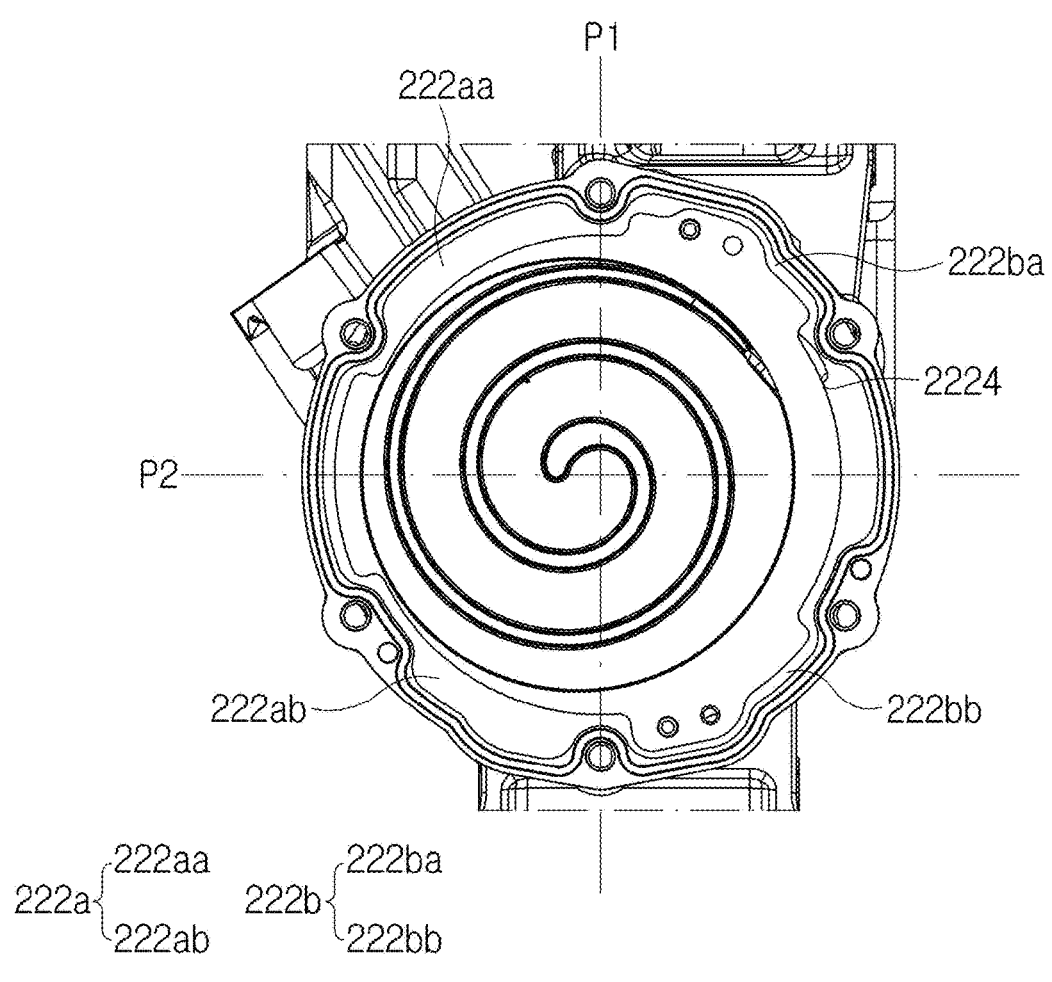
FIG. 9 is a front view showing a communication hole that guides refrigerant within a motor receiving space of FIG. 8 to a compression mechanism.
Figure 10:
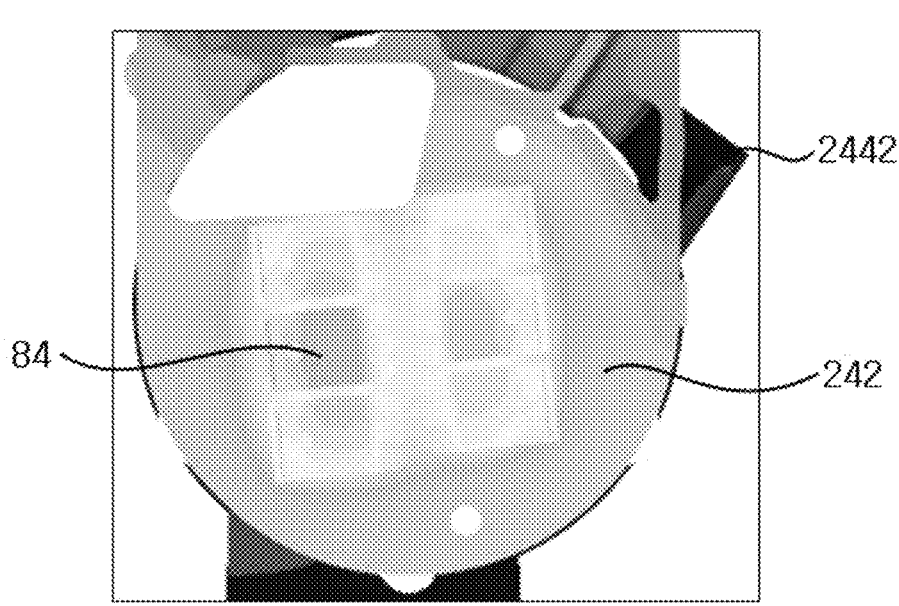
FIG. 10 is a temperature distribution diagram showing a temperature distribution of an inverter device in the electric compressor of FIG. 5.

FIG. 6 is a perspective view showing an electric compressor according to an embodiment of the present disclosure of which a front housing is partially cut away. FIG. 7 is a front view of FIG. 6. FIG. 8 is a front view showing that some parts of a motor are received in the front housing of FIG. 7. FIG. 9 is a front view showing a communication hole that guides refrigerant within a motor receiving space of FIG. 8 to a compression mechanism. FIG. 10 is a temperature distribution diagram showing a temperature distribution of an inverter device in the electric compressor of FIG. 5. For reference, in FIG. 10, the higher the temperature, the darker the shading.

Figure 1:
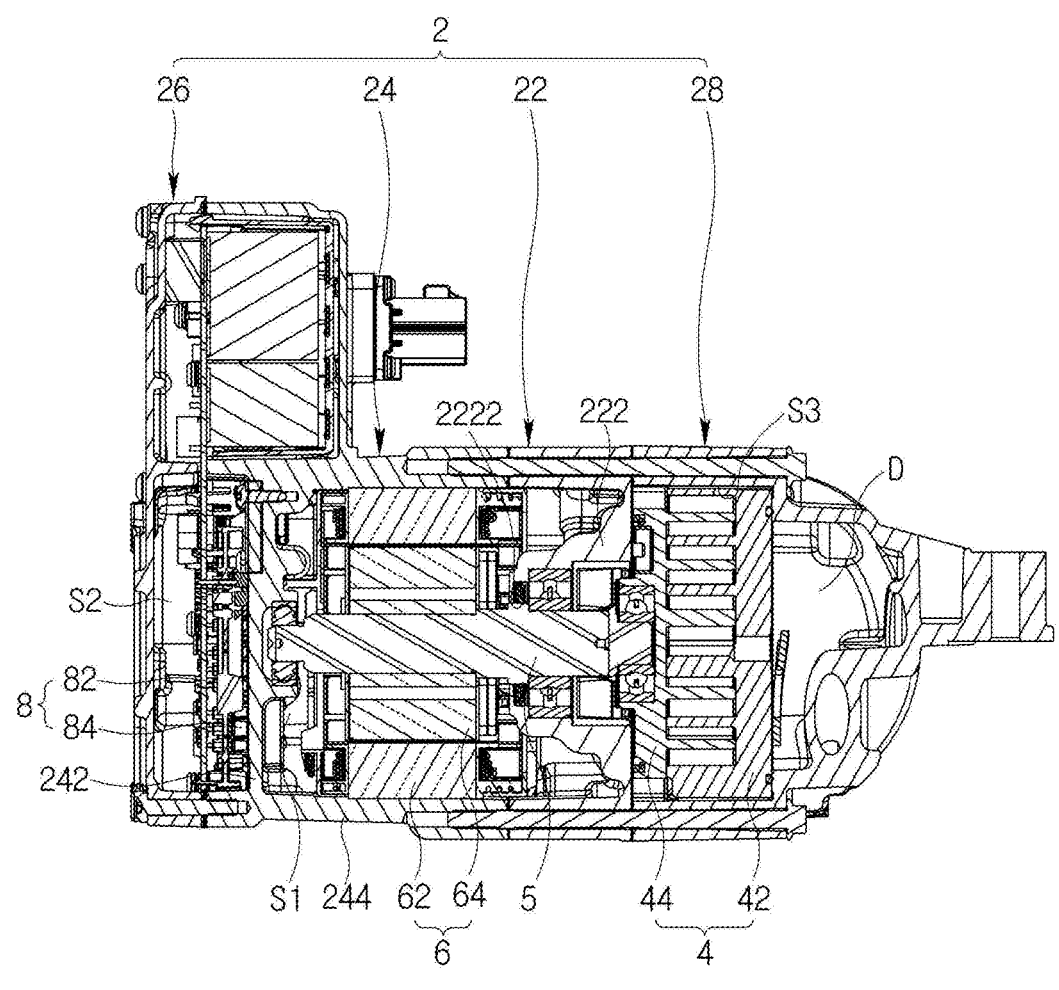
FIG. 1 is a cross-sectional view showing a conventional electric compressor.
Figure 2:
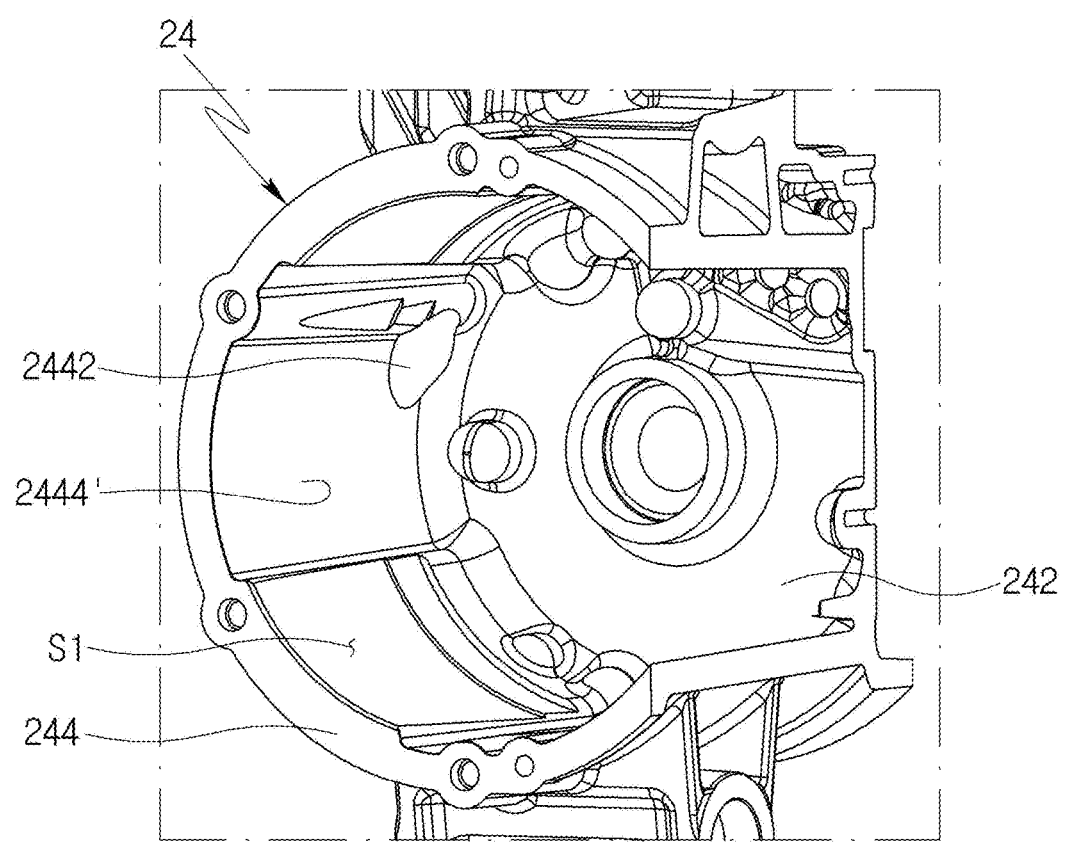
FIG. 2 is a perspective view showing the electric compressor of FIG. 1 of which a front housing is partially cut away.
Figure 3:
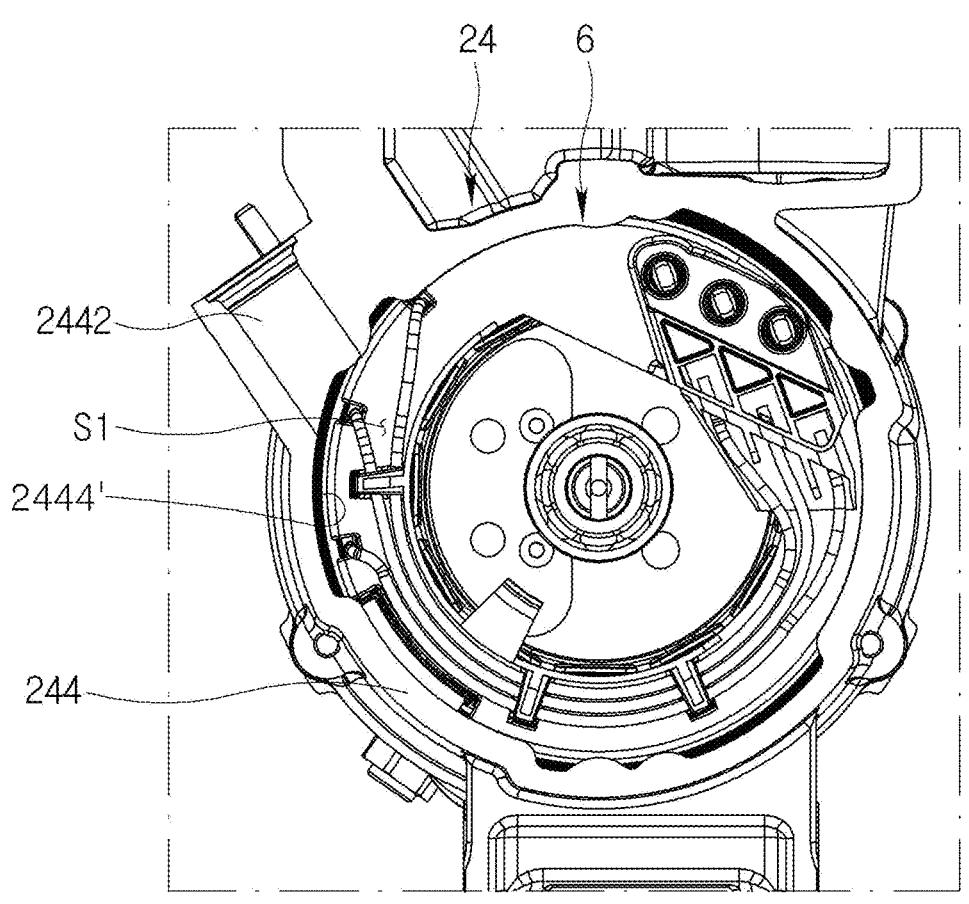
FIG. 3 is a front view showing that some parts of a motor are received in the front housing of FIG. 2.
Figure 4:
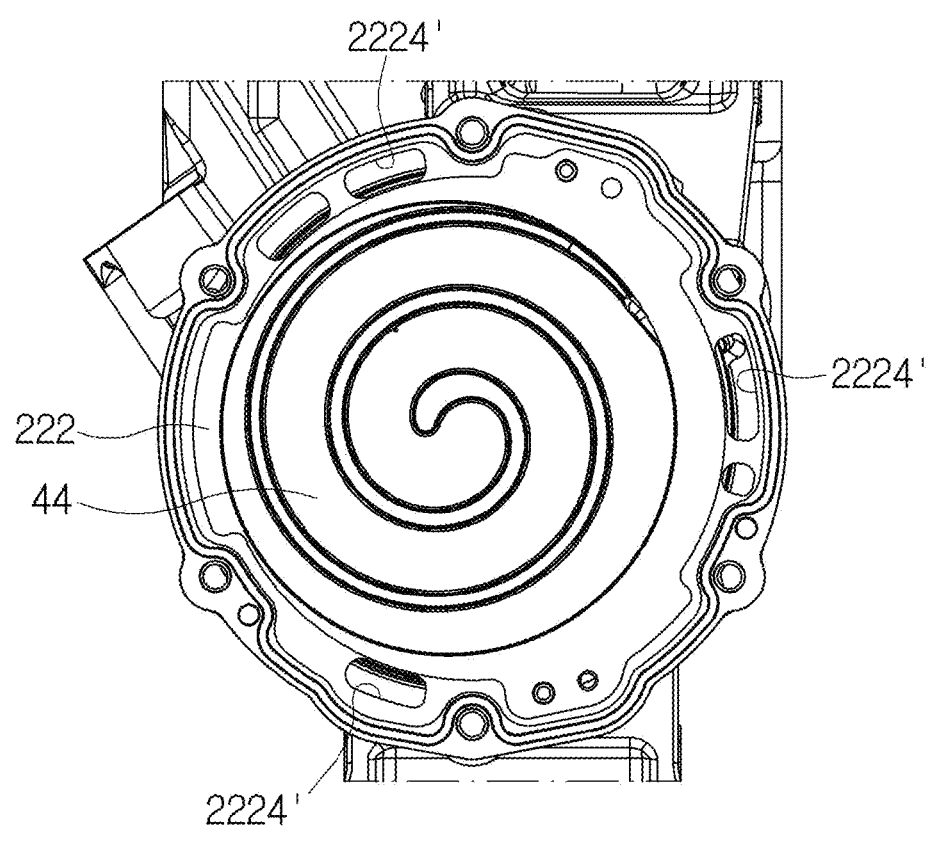
FIG. 4 is a front view showing a communication hole that guides refrigerant within a motor receiving space of FIG. 3 to a compression mechanism.

Meanwhile, reference is made to FIG. 1 for the description of components unshown in FIGS. 6 to 10.

Referring to the attached FIGS. 5 to 10 and FIG. 1, the electric compressor according to the embodiment of the present disclosure may include a housing 2, a compression mechanism 4 that is within the housing 2 and compresses a refrigerant, a motor 6 that provides power to the compression mechanism 4, and an inverter 8 that controls the motor 6.

The housing 2 includes a center housing 22, a front housing 24 that is coupled to the center housing 22 and forms a motor receiving space S1 in which the motor 6 is received, an inverter housing 26 that is coupled to the front housing 24 on the opposite side of the center housing 22 with respect to the front housing 24 and forms an inverter receiving space S2 in which the inverter 8 is received, and a rear housing 28 that is coupled to the center housing 22 on the opposite side of the front housing 24 with respect to the center housing 22 and forms a compression mechanism receiving space S3 in which the compression mechanism 4 is received and a discharge chamber D in which the refrigerant discharged from the compression mechanism 4 is received.

The center housing 22 may include a main frame 222 that divides the motor receiving space S1 and the compression mechanism receiving space S3.

The main frame 222 may include a shaft receiving hole 2222 into which a rotation shaft 5 for transmitting power from the motor 6 to the compression mechanism 4 is inserted, and a communication hole 2224 that guides the refrigerant of the motor receiving space S1 to the compression mechanism receiving space S3.

The shaft receiving hole 2222 may be formed at the center of the main frame 222 and pass through the main frame 222.

The communication hole 2224 may be formed on the outer circumferential portion of the main frame 222 and pass through the main frame 222.

Here, the communication hole 2224 is formed at a predetermined position on the outer circumferential portion of the main frame 222. This will be described later.

The front housing 24 may include a partition wall 242 and an annular wall 244. The partition wall 242 divides the motor receiving space S1 and the inverter receiving space S2. The annular wall 244 extends from an outer periphery of the partition wall 242, supports an outer circumferential surface of the motor 6, and is coupled to the center housing 22.

The partition wall 242 may include a first surface that faces the motor receiving space S1 and a second surface that forms a back side of the first surface and faces the inverter receiving space S2.

The first surface may include an annular shaft receiving recess 2426 that protrudes from the center of the first surface toward the motor receiving space S1. A bearing that supports the rotation shaft 5 may be inserted into the shaft receiving recess 2426.

Also, the first surface may further include a rib protruding from the first surface toward the motor receiving space S1.

The rib may include a first rib 2422 extending in the circumferential direction of the motor receiving space S1.

The first rib 2422 may be formed in plural numbers, and the plurality of first ribs 2422 may be formed apart from each other in the radial direction of the motor receiving space S1.

Here, the first rib 2422 is formed in the form of an arc that extends from a predetermined position to another predetermined position rather than in a continuous annular shape. This will be described later.

The second surface may be formed in a flat shape so as to come into contact with a device 84 of the inverter 8, which will be described later.

The annular wall 244 may include a suction port 2442 which passes through the annular wall 244 in such a way as to guide a low-temperature refrigerant to the motor receiving space S1.

Also, the annular wall 244 may further include an internal flow path 2444 that is formed concavely on an inner circumferential surface of the annular wall 244, is spaced apart from the outer circumferential surface of the motor 6, and extends toward the compression mechanism 4.

Here, the suction port 2442 and the internal flow path 2444 are formed at a predetermined position. This will be described later.

The motor 6 may include a stator 62 supported on the annular wall 244, and a rotor 64 that is located within the stator 62 and is rotated by the interaction with the stator 62. The rotor 64 may be coupled to the rotation shaft 5.

The compression mechanism 4 may include a fixed scroll 42 that is fixedly installed thereon and an orbiting scroll 44 that is engaged with the fixed scroll 42, forms, together with the fixed scroll 42, a compression chamber, and performs an orbiting motion by the rotation shaft 5.

Here, in the embodiment, the compression mechanism 4 is formed in a so-called scroll type, and is not limited to this. The compression mechanism 4 may be formed in different types such as in a reciprocating type, in a vane rotary type, etc.

The inverter 8 may include a substrate 82 on which a plurality of the devices 84 required for control are mounted.

Here, the plurality of devices 84 includes a heat-generating device such as a switching element, for example, an insulated gate bipolar transistor (IGBT), an intelligent power module (IPM), etc. At least a portion of the heating element may be in contact with the second surface of the partition wall 242 for heat radiation.

In the electric compressor having such a structure according to the embodiment of the present disclosure, when power is applied to the motor 6, low-temperature, the low-pressure and low-pressure refrigerant flows into the motor receiving space S1 through the suction port 2442, and the refrigerant in the motor receiving space S1 flows into the compression mechanism 4 through the internal flow path 2444 and the communication hole 2224, is compressed at high temperature and high pressure, and is then discharged to the outside of the housing 2 through the discharge chamber D.

Also, in this process, the motor 6 is controlled by the inverter 8, so that the cooling efficiency is variably controlled. Heat generated from the plurality of elements 84 is radiated to the refrigerant in the motor receiving space S1 through the partition wall 242.

Here, the electric compressor according to the embodiment, the suction port 2442, the internal flow path 2444, and the communication hole 2224 may be formed at predetermined positions respectively such that the refrigerant introduced from the suction port 2442 into the motor receiving space S1 flows in the circumferential direction of the motor receiving space S1, sufficiently cools the plurality of devices 84, and then is introduced into the compression mechanism 4.

Specifically, when it is assumed that an imaginary plane that includes a central axis "A" of the housing 2 and extends in the diameter direction of the housing 2 (more precisely, in the gravity direction and in a direction opposite to the gravity direction) is a first plane P1 and an imaginary plane that includes the central axis "A" of the housing 2 and is perpendicular to the first plane P1 is a second plane P2, the housing 2 may be divided into a housing first portion 2a located on one side of the first plane P1 (left side in FIG. 7) and a housing second portion 2b located on a side opposite to the housing first portion 2a (right side in FIG. 7).

The housing first portion 2a may be divided into a housing first-first portion 2aa located on one side of the second plane P2 (upper side in FIG. 7) and a housing first-second portion 2ab located on a side opposite to the housing first-first portion 2aa (lower side in FIG. 7).

Also, the housing second portion 2b may be divided into a housing second-first portion 2ba located on one side of the second plane P2 (upper side in FIG. 7) and a housing second-second portion 2bb located on a side opposite to the housing second-first portion 2ba (lower side in FIG. 7).

With respect to the central axis "A" of the housing 2, the housing first-first portion 2aa and the housing second-second portion 2bb may be located opposite to each other, and the housing first-second portion 2ab and the housing second-first portion 2ba may be located opposite to each other.

According to this division, the partition wall 242 may be divided into a partition wall first portion 242a included in the housing first portion 2a and a partition wall second portion 242b included in the housing second portion 2b. The partition wall first portion 242a may be divided into a partition wall first-first portion 242aa included in the housing first-first portion 2aa and a partition wall first-second portion 242ab included in the housing first-second portion 2ab. The partition wall second portion 242b may be divided into a partition wall second-first portion 242ba included in the housing second-first portion 2ba and a partition wall second-second portion 242bb included in the housing second-second portion 2bb.

Similarly, the annular wall 244 may be divided into an annular wall first portion 244a included in the housing first portion 2a and an annular wall second portion 244b included in the housing second portion 2b. The annular wall first portion 244a may be further divided into an annular wall first-first portion 244aa included in the housing first-first portion 2aa and an annular wall first-second portion 244ab included in the housing first-second portion 2ab. The annular wall second portion 244b may be divided into an annular wall second-first portion 244ba included in the housing second-first portion 2ba and an annular wall second-second portion 244bb included in the housing second-second portion 2bb.

Furthermore, the main frame 222 may be divided into a main frame first portion 222a included in the housing first portion 2a and a main frame second portion 222b included in the housing second portion 2b. The main frame first portion 222a may be divided into a main frame first-first portion 222aa included in the housing first-first portion 2aa and a main frame first-second portion 222ab included in the housing first-second portion 2ab. The main frame second portion 222b may be divided into a main frame second-first portion 222ba included in the housing second-first portion 2ba and a main frame second-second portion 222bb included in the housing second-second portion 2bb.

Here, unlike the embodiment, if the suction port 2442 is assumed to be formed in the annular wall first portion 244a and the internal flow path 2444 is assumed to be formed in both the annular wall first portion 244a and the annular wall second portion 244b, and if the communication hole 2224 is assumed to be formed in both the main frame first portion 222a and the main frame second portion 222b, the refrigerant entering the motor receiving space S1 through the suction port 2442 is guided to the compression mechanism 4 mainly through the internal flow path 2444 formed in the annular wall first portion 244a and the communication hole 2224 formed in the main frame first portion 222a and is hardly guided to the compression mechanism 4 through the internal flow path 2444 formed in the annular wall second portion 244b and the communication hole 2224 formed in the main frame second portion 222b. This may lead to the same problem as the conventional technology in which the device 84 of the inverter 8 cannot be sufficiently cooled.

Considering this, in the embodiment of the present disclosure, as shown in FIGS. 7 and 8, when the suction port 2442 is formed in the annular wall first portion 244a, the internal flow path 2444 may be formed in the annular wall second portion 244b and may not be formed in the annular wall first portion 244a. In other words, the inner circumferential surface of the annular wall first portion 244a is in contact with the outer circumferential surface of the motor 6 as a whole, so that there may not exist the internal flow path 2444 between the inner circumferential surface of the annular wall first portion 244a and the outer circumferential surface of the motor 6. Also, as shown in FIG. 9, the communication hole 2224 may be formed in the main frame second portion 222b and may not be formed in the main frame first portion 222a. As a result, the refrigerant entering the motor receiving space S1 through the suction port 2442 may sufficiently flow mainly from the annular wall first portion 244a to the annular wall second portion 244b in the circumferential direction, and then may be guided to the compression mechanism 4 through the internal flow path 2444 formed in the annular wall second portion 244b and the communication hole 2224 formed in the main frame second portion 222b. This increases the flow distance and residence time of the refrigerant within the motor receiving space S1, and thus, the heat exchange time between the partition wall 242 and the refrigerant of the motor receiving space S1 is increased. As a result, as shown in FIG. 10, the plurality of the devices 84 of the inverter 8 are sufficiently cooled overall, and the temperature deviation between the plurality of the devices 84 is suppressed, so that the fire, operation stop, and increase in maintenance cost can be prevented.

In order to further increase the flow distance and residence time of the refrigerant within the motor receiving space S1, it may be preferable that the suction port 2442 should be formed in the annular wall first-first portion 244*aa*, the internal flow path 2444 should be formed in the annular wall second-first portion 244*ba*, and the communication hole 2224 should be formed in the main frame second-first portion 222*ba*.

Here, it may be preferable that the suction port 2442 is formed to open towards the annular wall first-second portion 244*ab* in such a manner as to guide the refrigerant to flow through a relatively long flow path.

Meanwhile, in the embodiment, the internal flow path 2444 is formed in plural numbers within a range of the annular wall second portion 244*b* such that the refrigerant of the motor receiving space S1 is smoothly supplied to the compression mechanism 4. In other words, the internal flow path 2444 includes a first internal flow path 2444*a* formed in the annular wall second-first portion 244*ba* and a second internal flow path 2444*b* formed in the annular wall second-second portion 244*bb*. In this case, the flow rate of the refrigerant passing through the second internal flow path 2444*b* becomes greater than the flow rate of the refrigerant passing through the first internal flow path 2444*a*, so that the temperature deviation between the plurality of the devices 84 may somewhat increase. However, if the flow cross-sectional area of the first internal flow path 2444*a* is greater than that of the second internal flow path 2444*b*, the flow rate of the refrigerant passing through the first internal flow path 2444*a* increases and the flow rate of the refrigerant passing through the second internal flow path 2444*b* reduces, so that the increase of the temperature deviation between the plurality of the devices 84 can be suppressed. Also, if the communication hole 2224 is formed at a position facing a space between the first internal flow path 2444*a* and the second internal flow path 2444*b* in the circumferential direction in the main frame second-first portion 222*ba*, it can be helpful not only to increase the flow rate of the refrigerant passing through the first internal flow path 2444*a* and to decrease the flow rate of the refrigerant passing through the second internal flow path 2444*b*, but also to increase the flow distance and residence time of the refrigerant within the motor receiving space S1.

Also, in the embodiment, as the partition wall 242 includes the first rib 2422 that protrudes towards the motor receiving space S1, a heat exchange area between the partition wall 242 and the refrigerant in the motor receiving space S1 is increased, and thus, heat radiation performance is improved, and the plurality of elements 84 can be sufficiently cooled as a whole.

Also, the first rib 2422 is formed in plural numbers, so that the heat exchange area can be further increased.

Also, as shown in FIGS. 6 and 7, each of the plurality of first ribs 2422 is formed in an arc shape which extends from the partition wall first portion 242*a* to the partition wall second portion 242*b* in the circumferential direction of the motor receiving space S1. This allows the refrigerant entering the motor receiving space S1 through the suction port 2442 to be smoothly guided in the circumferential direction of the motor receiving space S1 to the internal flow path 2444 by the plurality of first ribs 2422.

Here, in order to guide the refrigerant more smoothly to the first internal flow path 2444*a*, it may be preferable that the farther the each of the plurality of first ribs 2422 is from the suction port 2442 in the circumferential direction of the motor receiving space S1, the more the radius of curvature of the first rib may decrease. However, the first rib is not limited to this. The farther at least one of the plurality of first ribs 2422 is from the suction port 2442 in the circumferential direction of the motor receiving space S1, the more the radius of curvature of the first rib may decrease.

In order that the plurality of first ribs 2422 is formed to be spaced apart from each other in the radial direction of the motor receiving space S1 and the refrigerant is easily introduced into a space between the plurality of first ribs 2422, it may be preferable that a spaced distance between the plurality of first ribs 2422 at a position adjacent to the suction port 2442 in the circumferential direction of the motor receiving space S1 is formed to be greater than a spaced distance between the plurality of first ribs 2422 at a position remote from the suction port 2442.

The plurality of first ribs 2422 includes a centripetal first rib 2422*a* and a centrifugal first rib 2422*b* which is formed on the radially outer side of the motor receiving space S1 with respect to the centripetal first rib 2422*a*. It may be preferable that a leading edge of the centripetal first rib 2422*a* is formed to overlap a leading edge of the centrifugal first rib 2422*b* in the radial direction of the motor receiving space S1 and a trailing edge of the centripetal first rib 2422*a* is formed to overlap a trailing edge of the centrifugal first rib 2422*b* in the radial direction of the motor receiving space S1, so that the circumferential length of the centrifugal first rib 2422*b* is formed to be greater than the circumferential length of the centripetal first rib 2422*a*.

Meanwhile, in the embodiment, the rib includes the first rib 2422 which extends in the circumferential direction of the motor receiving space S1. However, the rib is not limited to this.

Figure 11:
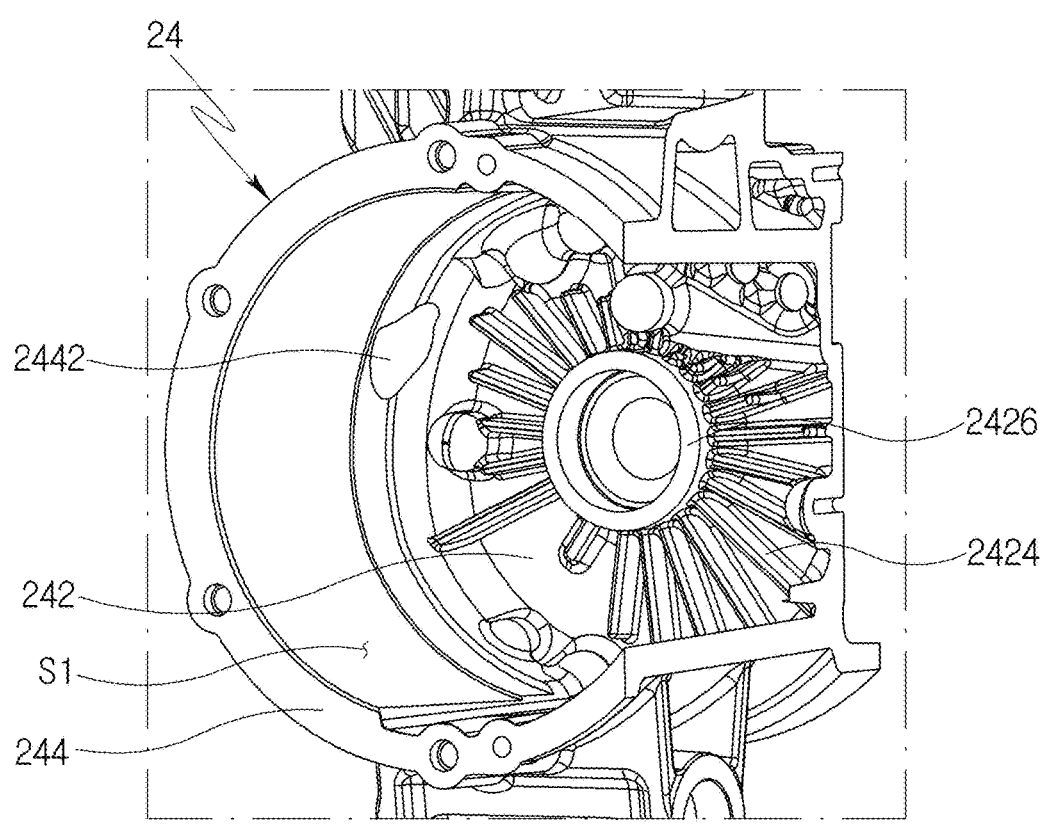
FIG. 11 is a perspective view showing an electric compressor according to another embodiment of the present disclosure of which a front housing is partially cut away.
Figure 12:
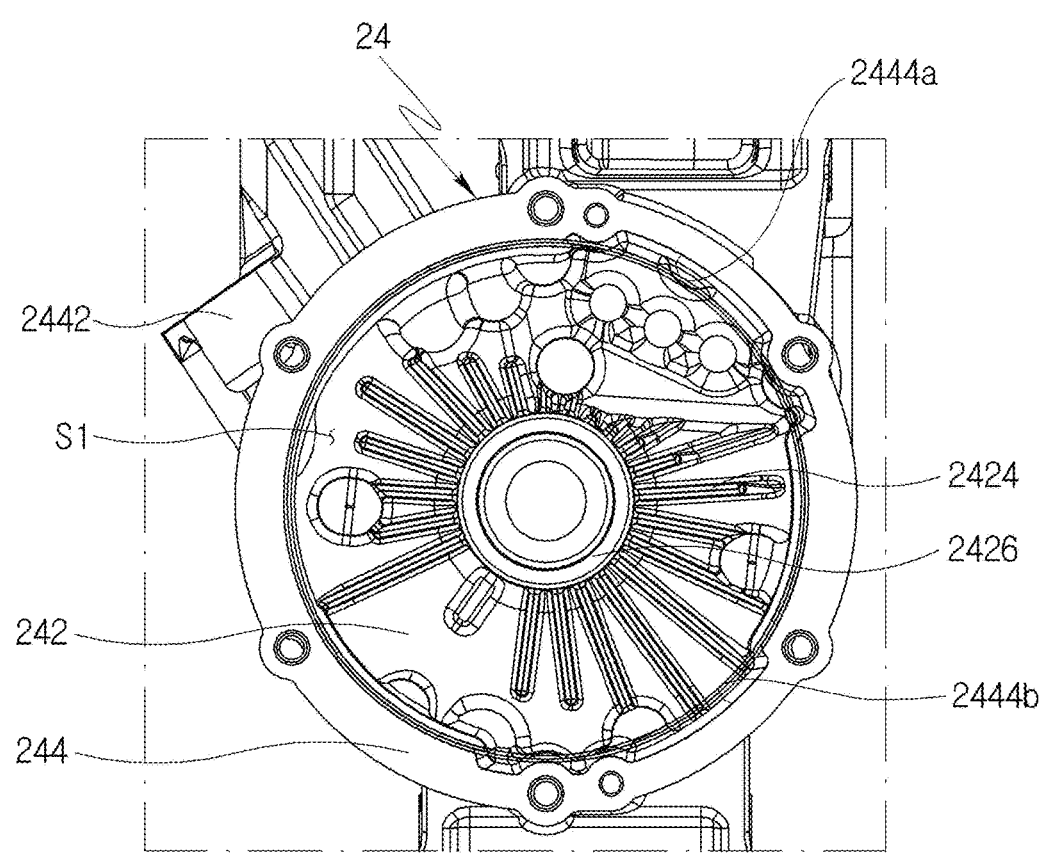
FIG. 12 is a front view of FIG. 11.

That is, for example, as shown in FIGS. 11 to 12, the rib may include a second rib 2424 which extends in the radial direction of the motor receiving space S1.

The second rib 2424 may be formed in plural numbers, and the plurality of second ribs 2424 may be arranged in the circumferential direction of the motor receiving space S1. The plurality of second ribs 2424 may extend from the shaft receiving recess 2426.

Here, some of the plurality of second ribs 2424 may extend from the shaft receiving recess 2426 to the annular wall 244.

Also, at least some of the plurality of second ribs 2424 may be formed with different lengths.

The plurality of second ribs 2424 may be formed on all of the partition wall first-first portion 242*aa*, the partition wall first-second portion 242*ab*, the partition wall second-first portion 242*ba*, and the partition wall second-second portion 242*bb*. An average length of the second ribs 2424 formed in the partition wall first-second portion 242*ab* and the partition wall second-second portion 242*bb*, which are located on the side in the direction of gravity (lower side in FIG. 12) based on the central axis "A" of the motor receiving space S1, may be formed to be greater than an average length of the second ribs 2424 formed in the partition wall first-first portion 242*aa* and the partition wall second-first portion 242*ba*, which are located on the side opposite to the direction of gravity (upper side in FIG. 12) based on the central axis "A" of the motor receiving space S1.

In this case, as the second rib 2424 extends in the radial direction of the motor receiving space S1, a flow resistance to the refrigerant in the motor receiving space S1 increases, so that the flow rate of the refrigerant in the motor receiving space S1 may be reduced. As a result, heat exchange time between the partition wall 242 and the refrigerant in the motor receiving space S1 is increased, and thus, the heat radiation performance can be improved.

Furthermore, as the second rib 2424 is formed in plural numbers and the plurality of second ribs 2424 is arranged in the circumferential direction of the motor receiving space S1, the heat exchange area is further increased and the flow resistance is further increased, so that the heat radiation performance can be further improved.

Also, though not shown separately in the drawing, the rib may include both the first rib 2422 and the second rib 2424. In this case, in order that the refrigerant of the motor receiving space S1 is guided in the circumferential direction of the motor receiving space S1 by the first rib 2422 while receiving the flow resistance by the second rib 2424, and in order that the heat radiation performance is further increased, it may be preferable that the protrusion height of the first rib 2422 should be greater than the protrusion height of the second rib 2424.

The invention claimed is:

1. An electric compressor comprising:
a motor that generates power;
a compression mechanism that receives the power from the motor and compresses a refrigerant; and
an inverter that controls the motor, wherein a housing receiving the motor and the inverter includes a partition wall that divides a motor receiving space where the motor is received and an inverter receiving space where the inverter is received, and a suction port that introduces refrigerant from outside to the motor receiving space, wherein at least one internal flow path is formed between an inner circumferential surface of the housing and an outer circumferential surface of the motor, and wherein the internal flow path and the suction port are formed on opposite sides of each other with respect to a first plane, that is, an imaginary plane which includes a central axis of the housing and is perpendicular to a ground surface, wherein the housing is divided into a housing first portion located on one side of the first plane and a housing second portion located on a side opposite to the housing first portion, wherein an annular wall of the housing, which supports the outer circumferential surface of the motor, includes an annular wall first portion included in the housing first portion and an annular wall second portion included in the housing second portion, the suction port is formed in the annular wall first portion, and the internal flow path is formed in the annular wall second portion, and an inner circumferential surface of the annular wall first portion is in contact with the outer circumferential surface of the motor as a whole.

2. The electric compressor of claim 1, wherein the housing further comprises a main frame which divides a compression mechanism receiving space that receives the compression mechanism from the motor receiving space, and a communication hole which passes through the main frame and communicates the motor receiving space with the compression mechanism receiving space, and wherein the main frame includes a main frame second portion included in the housing second portion, the communication hole is formed in the main frame second portion.

3. The electric compressor of claim 2, wherein an imaginary plane that includes the central axis of the housing and is perpendicular to the first plane is set to a second plane, wherein the housing first portion is divided into a housing first-first portion located on one side of the second plane and a housing first-second portion located on a side opposite to the housing first-first portion, wherein the housing second portion is divided into a housing second-first portion located on one side of the second plane and a housing second-second portion located on a side opposite to the housing second-first portion, wherein, with respect to the central axis of the housing, the housing first-first portion and the housing second-second portion are located opposite to each other, and the housing first-second portion and the housing second-first portion are located opposite to each other, wherein the suction port is formed in an annular wall first-first portion of the annular wall, which is included in the housing first-first portion, wherein the internal flow path includes a first internal flow path formed in an annular wall second-first portion of the annular wall, which is included in the housing second-first portion, and wherein the communication hole is formed in a main frame second-first portion of the main frame, which is included in the housing second-first portion.

4. The electric compressor of claim 3, wherein the suction port is formed to open towards an annular wall first-second portion of the annular wall, which is included in the housing first-second portion.

5. The electric compressor of claim 3, wherein the internal flow path further includes a second internal flow path formed in an annular wall second-second portion of the annular wall, which is included in the housing second-second portion.

6. The electric compressor of claim 5, wherein the communication hole is formed to be in communication with a space between the first internal flow path and the second internal flow path in a circumferential direction.

7. The electric compressor of claim 1, wherein the partition wall further comprises a rib which protrudes from a surface facing the motor receiving space.

8. The electric compressor of claim 7, wherein the rib further comprises a first rib which extends in a circumferential direction of the motor receiving space.

9. The electric compressor of claim 8, wherein the first rib extends from a partition wall first portion of the partition wall, which is included in the housing first portion, to a partition wall second portion of the partition wall, which is included in the housing second portion.

10. The electric compressor of claim 8, wherein the first rib is formed in plural numbers, and the plurality of first ribs are formed apart from each other in a radial direction of the motor receiving space.

11. An electric compressor comprising:
a motor that generates power;
a compression mechanism that receives the power from the motor and compresses a refrigerant; and
an inverter that controls the motor, wherein a housing receiving the motor and the inverter includes a partition wall that divides a motor receiving space where the motor is received and an inverter receiving space where the inverter is received, and a suction port that introduces refrigerant from outside to the motor receiving space, wherein at least one internal flow path is formed between an inner circumferential surface of the housing and an outer circumferential surface of the motor, wherein the internal flow path and the suction port are formed on opposite sides of each other with respect to a first plane, that is, an imaginary plane which includes a central axis of the housing and is perpendicular to a ground surface, wherein the housing is divided into a housing first portion located on one side of the first plane and a housing second portion located on a side opposite to the housing first portion, wherein an annular wall of the housing, which supports the outer circumferential surface of the motor, includes an annular wall first portion included in the housing first portion and an annular wall second portion included in the housing second portion, the suction port is formed in the annular wall first portion, and the internal flow path is formed in the annular wall second portion, wherein the partition wall further comprises a rib which protrudes from a surface facing the motor receiving space, wherein the rib further comprises a first rib which extends in a circumferential direction of the motor receiving space, wherein the first rib is formed in plural numbers, and the plurality of first ribs are formed apart from each other in a radial direction of the motor receiving space, and wherein a farther a distance at least one of the plurality of first ribs is from the suction port in the circumferential direction of the motor receiving space, a radius of curvature of the first rib decreases more.

12. An electric compressor comprising:
a motor that generates power;
a compression mechanism that receives the power from the motor and compresses a refrigerant; and
an inverter that controls the motor, wherein a housing receiving the motor and the inverter includes a partition wall that divides a motor receiving space where the motor is received and an inverter receiving space where the inverter is received, and a suction port that intro-duces refrigerant from outside to the motor receiving space, wherein at least one internal flow path is formed between an inner circumferential surface of the housing and an outer circumferential surface of the motor, wherein the internal flow path and the suction port are formed on opposite sides of each other with respect to a first plane, that is, an imaginary plane which includes a central axis of the housing and is perpendicular to a ground surface, wherein the housing is divided into a housing first portion located on one side of the first plane and a housing second portion located on a side opposite to the housing first portion, wherein an annu-lar wall of the housing, which supports the outer circumferential surface of the motor, includes an annu-lar wall first portion included in the housing first portion and an annular wall second portion included in the housing second portion, the suction port is formed in the annular wall first portion, and the internal flow path is formed in the annular wall second portion, wherein the partition wall further comprises a rib which protrudes from a surface facing the motor receiving space, wherein the rib further comprises a first rib which extends in a circumferential direction of the motor receiving space, wherein the first rib is formed in plural numbers, and the plurality of first ribs are formed apart from each other in a radial direction of the motor receiving space, and wherein a spaced distance between the plurality of first ribs at a position adjacent to the suction port in the circumferential direction of the motor receiving space is formed to be greater than a spaced distance between the plurality of first ribs at a position remote from the suction port.

13. The electric compressor of claim 8, wherein the rib further comprises a second rib which extends in a radial direction of the motor receiving space.

14. The electric compressor of claim 1, wherein the inverter further comprises a switching element, and at least a portion of the switching element is in contact with the partition wall in the inverter receiving space.

* * * * *